US006417719B1

(12) United States Patent
Deam

(10) Patent No.: US 6,417,719 B1
(45) Date of Patent: Jul. 9, 2002

(54) APPARATUS AND METHOD FOR ISOLATING A TRIGGER CIRCUIT OF A SILICON-CONTROLLED RECTIFIER

(75) Inventor: David R. Deam, San Ramon, CA (US)

(73) Assignee: Electric Power Research Institute, Inc., Palo Alto, CA (US)

( * ) Notice: Subject to any disclaimer, the term of this patent is extended or adjusted under 35 U.S.C. 154(b) by 0 days.

(21) Appl. No.: 09/797,265

(22) Filed: Feb. 28, 2001

Related U.S. Application Data
(60) Provisional application No. 60/186,000, filed on Mar. 1, 2000, provisional application No. 60/186,093, filed on Mar. 1, 2000, and provisional application No. 60/186,094, filed on Mar. 1, 2000.

(51) Int. Cl.[7] .............................................. H03K 17/72
(52) U.S. Cl. ...................................................... 327/438
(58) Field of Search ................................ 327/438, 439, 327/445, 446, 453, 454, 455, 456, 457, 458, 459, 460, 468, 475

(56) References Cited

U.S. PATENT DOCUMENTS 4,274,135 A * 6/1981 Rosa et al. .................. 327/460
6,342,997 B1 * 1/2002 Khadkikar et al. ......... 361/100

\* cited by examiner

*Primary Examiner*—Jeffrey Zweizig
(74) *Attorney, Agent, or Firm*—Pennie & Edmonds LLP

(57) ABSTRACT

An apparatus for isolating driver circuits from silicon-controlled rectifier (SCR) circuits in an electric switch. The driver circuits are located on a driver-board, which includes an infrared (IR) emitter. The SCR circuits are located on a SCR switch-board, which includes an IR receiver. An insulating body is positioned between the driver-board and the switch-board. The insulating body encloses a light-pipe to optically link the infrared emitter to the infrared detector. Control signals can be communicated from the driver circuits to the SCR circuits via the IR emitter, the light-pipe, and the IR receiver.

21 Claims, 5 Drawing Sheets

US 6,417,719 B1

APPARATUS AND METHOD FOR ISOLATING A TRIGGER CIRCUIT OF A SILICON-CONTROLLED RECTIFIER

The present application claims the priority of U.S. provisional patent applications bearing serial No. 60/186,000, 60/186,093, and 60/186,094, all of which were filed on Mar. 1, 2000.

CROSS REFERENCES

The present application is related to the following applications which are incorporated herein by reference: United States Patent Application entitled "APPARATUS AND METHOD FOR UTILIZING A SNUBBER CAPACITOR TO POWER A SILICON-CONTROLLED RECTIFIER GATE TRIGGER CIRCUIT," and application serial no. (TBD), and United States Patent Application entitled "LOW POWER GATE TRIGGER CIRCUIT FOR CONTROLLING A SILICON-CONTROLLED RECTIFIER CIRCUIT," and application serial no. (TBD). All of the above applications are filed simultaneously herewith on (TBD).

BRIEF DESCRIPTION OF THE INVENTION

This invention relates generally to the control of power supplies. More particularly, this invention relates to a technique for isolating a trigger circuit of a silicon-controlled rectifier used to control a power supply.

BACKGROUND OF THE INVENTION

High voltage applications of power electronic switches require that many power electronic devices be in series. Each of these devices must have a gate trigger circuit and this circuit must have voltage isolation. This voltage isolation is typically attained by using transformers with isolated windings.

It would be highly desirable to achieve voltage isolation without incurring the expense of transformers with isolated windings.

SUMMARY OF THE INVENTION

An apparatus for isolating driver circuits from silicon-controlled rectifier (SCR) circuits in a power electronics switch. Driver circuits, including an infrared emitter, are included in a driver circuit board. Switch circuits, including a SCR and an infrared detector, are included in a SCR circuit board. A plurality of electrically insulating bodies are positioned between the driver circuit board and the SCR circuit board. The electrically insulating bodies each enclose a light-pipe to optically link the infrared emitters to the infrared detectors.

The driver circuits and the switch circuits of a power electronics switch must be electrically isolated. Yet, the control signals must be sent from the driver circuits to the switch circuits. According to the present invention, electrical isolation is accomplished by the electrically insulting bodies that separate the driver circuits board and the and SCR circuit board. Signal communication between the driver circuits and the switch circuits is accomplished by the infrared emitters, the infrared detectors, and the light-pipes. The electrically insulting bodies also acts physical mounting structures for the light pipes.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

An objective of the present invention is to electrically isolate driver circuits from switch (SCR) circuits in a power electronics switch. This objective is accomplished by putting driver circuits and switch circuits on a separate circuit boards. A plurality of electrically insulating bodies made of an insulating material, such as polycarbonate, are placed between the driver circuit board and the switch circuit board. The electrically insulating bodies create a rigid connection between the driver board and switch board. Each of the electrically insulating bodies also holds a light-pipe, which is made of a light-conducting material, such as plexiglass. The electrically insulting bodies maintain proper spacing for voltage isolation. An infraread (IR) emitter is positioned at the driver board end of the light-pipe, and an IR detector is positioned at the switch board end of the light-pipe. Control signals can then be communicated from the driver circuits to the switch circuits via the IR emitter, the light-pipe, and the IR detector.

Figure 1:
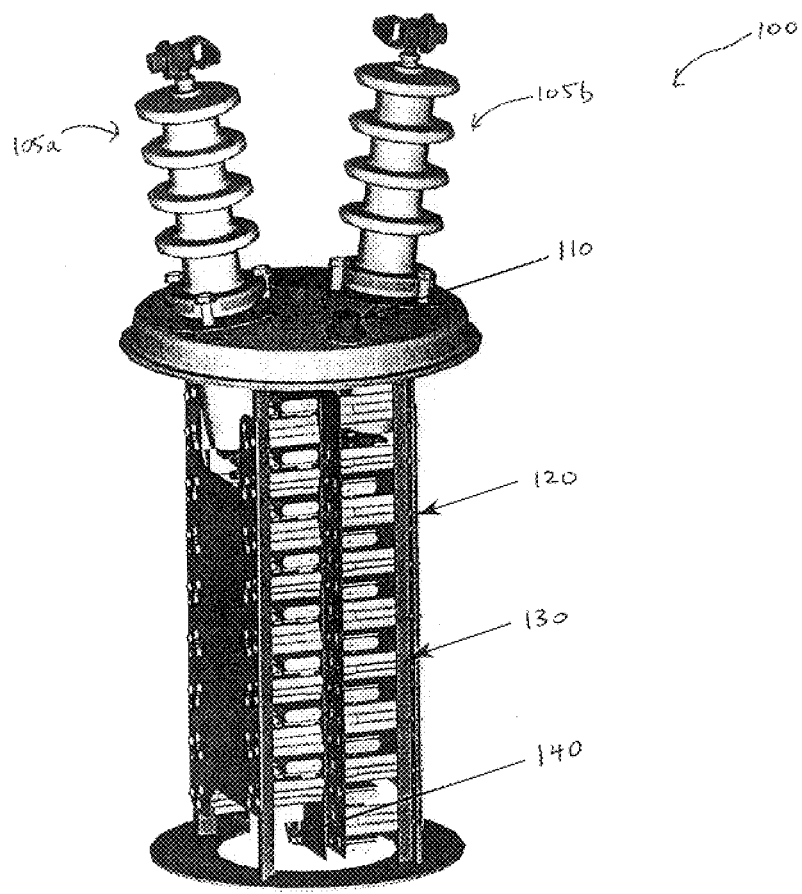
FIG. 1 illustrates a switch in accordance with an embodiment of the invention.

The features of the invention are more fully appreciated in connection with the following discussion of the figures. FIG. 1 illustrates a power electronics switch 100 with its external housing or "can" removed. As shown, the device 100 includes an input terminal 105a, an output terminal 105b, a control connector 110, two circuit board assemblies 120, a structural framework 130, and a fusible return-link 140. Input terminal 105a and output terminal 105b are typically coupled to a high-voltage (e.g., 13,800 Volts) transmission line. A mechanical circuit breaker or circuit closer is typically coupled in parallel with the power electronics switch 100.

Figure 2:
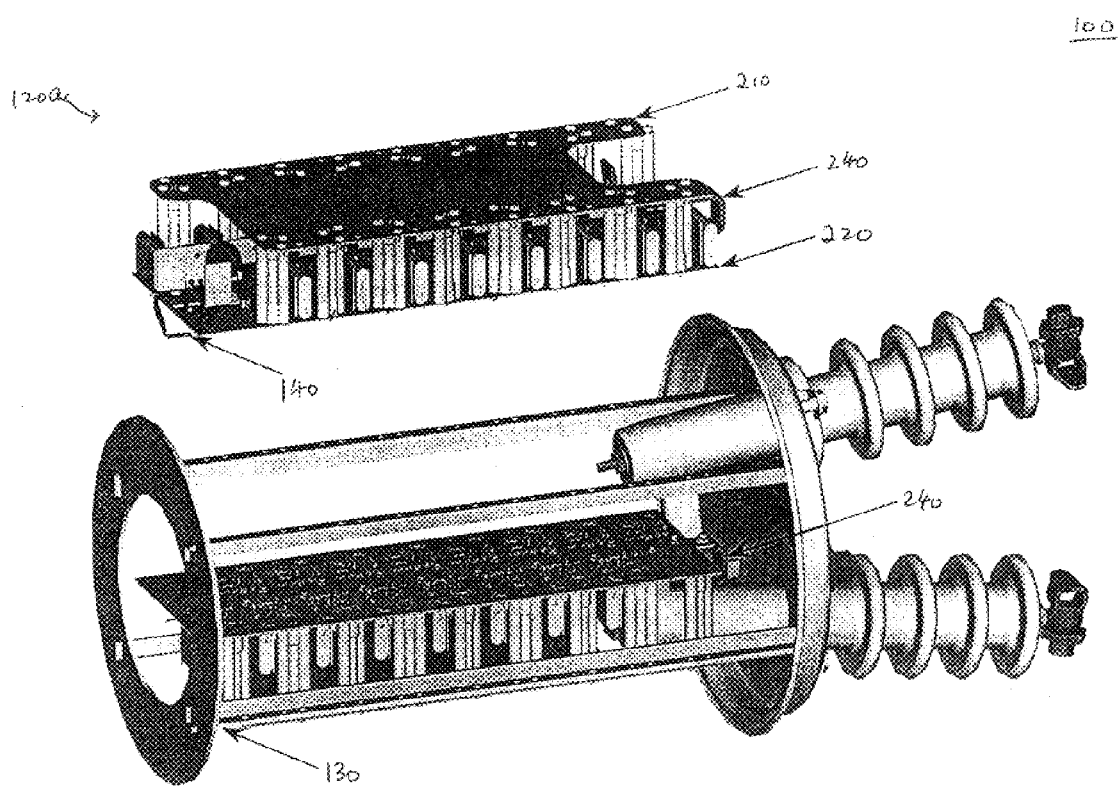
FIG. 2 is an exploded view of the switch of FIG. 1.

FIG. 2 is an exploded view of the device 100 of FIG. 1. As shown, one circuit board assembly 120a is detached from the structural framework 130. The figure also illustrates the fusible return-link 140, an input termination node 240, an output termination node 250, and the structural framework 130. The circuit board assembly 120a includes a driver circuit board 210 and a switch circuit board 220.

Figure 3:
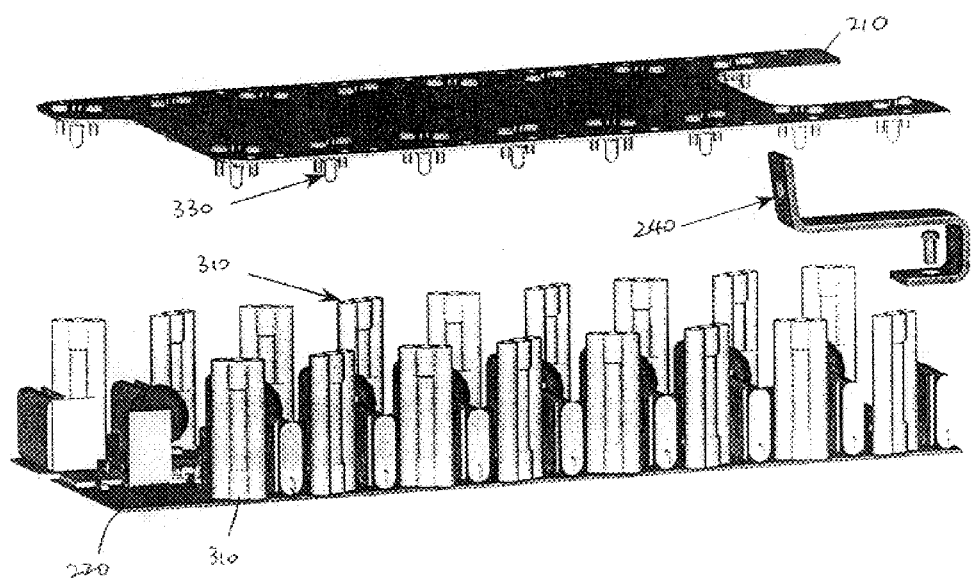
FIG. 3 illustrates a soft-switch assembly in accordance with an embodiment of the invention.

FIG. 3 is an exploded view of the circuit board assembly 120a, illustrating the driver circuit board 210, the switch circuit board 220, and the input termination node 240. As shown, the driver board 210 includes multiple infrared (IR) emitters 330. Although driver circuits are not shown in FIG. 3, it is understood that they are located on the driver circuit board 210 and that they are coupled to the IR emitters 330. Also illustrated in FIG. 3 are electrical insulators 310 that are positioned on the switch circuit board 220. It can be appreciated in FIG. 3 that the infrared emitters 330 are configured for coupling to the electrical insulators 310 of the switch circuit board 220. The electrical insulators 310 are made with an insulating material such as polycarbonate.

Figure 4:
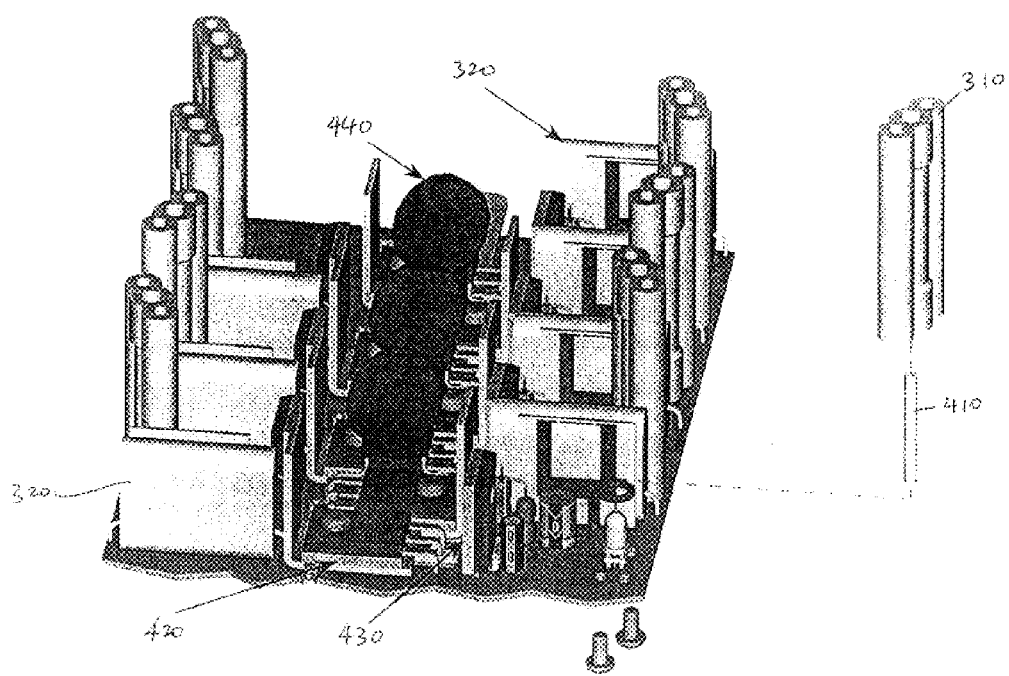
FIG. 4 illustrates switch board components in accordance with an embodiment of the invention.

FIG. 4 illustrates component details of the switch circuit board 220. FIG. 4 also shows a light-pipe 410 that is encased by a electrical insulator 310. In the present embodiment, the light-pipe 410 is a tube made of a clear light-conducting material, such as plexiglass. FIG. 3 also illustrates varistors 440, snubber capacitors 320, silicon-controlled rectifiers 420, and metal-oxide semiconductor field effect transistor (MOSFET) SCR gate circuits 430 located on the switch circuit board 220. The MOSFET SCR gate trigger circuits 430 and the silicon-controlled rectifiers 420 may have to be able to operate under high voltage (e.g., around 1600 V) conditions.

An implementation of the MOSFET SCR gate trigger circuit 430 can be found in copending United States patent application entitled "LOW POWER GATE TRIGGER CIRCUIT FOR CONTROLLING A SILICON-CONTROLLED RECTIFIER CIRCUIT." The MOSFET SCR gate trigger circuits 430 are preferably electrically isolated and configured for receiving power from snubber capacitors 320. A power supply circuit for generating power using a snubber capacitor can be found in co-pending United States patent application entitled "APPARATUS AND METHOD FOR UTILIZING A SNUBBER CAPACITOR TO POWER A SILICON-CONTROLLED RECTIFIER GATE TRIGGER CIRCUIT."

Figure 5:
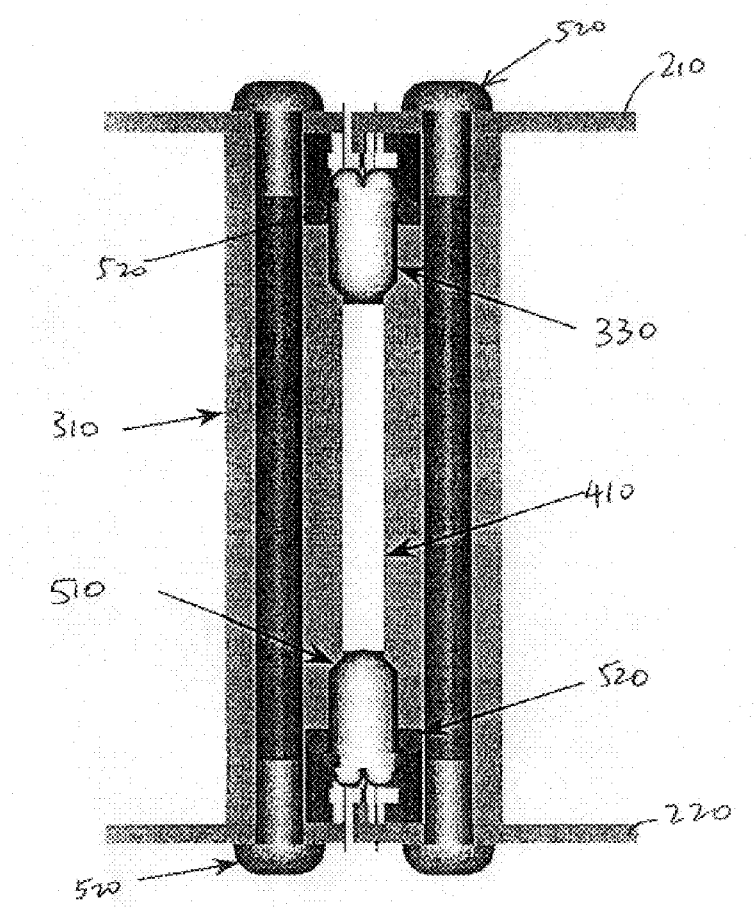
FIG. 5 illustrates a high-voltage optical-coupler in accordance with an embodiment of the invention.

FIG. 5 provides is a cross-sectional view across a electrical insulator 310 when the circuit board assembly 120a is assembled. As shown, the driver board 210 and the Switch circuit board 220 are fastened to the electrical insulator 310 by fasteners 520. The electrical insulator 310 is shaped such that, when it is fastened to the driver board 210 and the Switch circuit board 220, the IR emitter 330, the light-pipe 410 and the IR detector 510 line up such that IR emitted from IR emitter 330 can be communicated to the IR detector 510 via the light-pipe 410. Also illustrated are O-ring seals 520.

In operation, signals generated by driver circuits (not shown) are converted into optical signals and are transmitted by the IR emitter 330 to the IR detector 510. The detected optical signals are then converted into electrical signals for controlling a MOSFET SCR gate trigger circuit 430. The MOSFET SCR gate trigger circuit 430 in turn controls the opening and closing of SCR 420. Since signals are not communicated electrically from the driver circuits to the switch circuits, voltage isolation is achieved.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An apparatus for providing voltage isolation between a driver circuit and a silicon-controlled rectifier control circuit, comprising:

a first circuit board supporting an optical emitter that is coupled to the driver circuit;

a second circuit board supporting an optical detector that is coupled to the silicon-controlled rectifier control circuit; and an insulating body interposed between the first circuit board and the second circuit board, the insulating body enclosing a light conductor to provide an optical link between the optical emitter and the optical detector and to enable communications between the driver circuit and the silicon-controlled rectifier control circuit via the optical link.

2. The apparatus of claim 1, wherein the insulating body rigidly affixes the first circuit board to the second circuit board.

3. The apparatus of claim 1, wherein the optical emitter comprises an infrared emitter.

4. The apparatus of claim 1, wherein the optical detector comprises an infrared detector.

5. The apparatus of claim 1, wherein the silicon-controlled rectifier control circuit comprises a MOSFET silicon-controlled rectifier gate trigger circuit.

6. The apparatus of claim 1, wherein the second circuit board comprises a silicon-controlled rectifier circuit.

7. The apparatus of claim 1, wherein the second circuit board comprises a snubber capacitor coupled to the silicon-controlled rectifier control circuit.

8. The apparatus of claim 1, wherein the second circuit board comprises a varistor.

9. The apparatus of claim 1, wherein the light conductor comprises a light-pipe.

10. The apparatus of claim 1, wherein the insulating body comprises polycarbonate.

11. An apparatus for providing voltage isolation between a driver circuit and a silicon-controlled rectifier control circuit, comprising:

a first circuit board supporting an infrared emitter that is coupled to the driver circuit;

a second circuit board supporting an infrared detector that is coupled to the silicon-controlled rectifier control circuit, the second circuit board further supporting a silicon-controlled rectifier circuit coupled to the silicon-controlled rectifier control circuit, the silicon-controlled rectifier control circuit comprising a MOSFET silicon-controlled rectifier gate trigger circuit; and an insulating body interposed between and rigidly affixed to the first circuit board and the second circuit board, the insulating body enclosing a light-pipe to provide an optical link between the infrared emitter and the infrared detector and to enable communications between the driver circuit and the silicon-controlled rectifier control circuit via the optical link.

12. An apparatus for providing voltage isolation between a plurality of driver circuits and a plurality of silicon-controlled rectifier control circuits, comprising:

a first circuit board supporting a plurality of optical emitters that are coupled to the plurality of driver circuits;

a second circuit board supporting a plurality of optical detectors that are coupled to the plurality of silicon-controlled rectifier control circuits; and a plurality of insulating bodies interposed between the first circuit board and the second circuit board, the insulating bodies enclosing a plurality of light conductors to provide optical links between the optical emitters and the optical detectors and to enable communications between the driver circuits and the silicon-controlled rectifier control circuits via the optical links.

13. The apparatus of claim 12, wherein the insulating bodies rigidly affix the first circuit board to the second circuit board.

14. The apparatus of claim 12, wherein the optical emitters comprise infrared emitters.

15. The apparatus of claim 12, wherein the optical detectors comprise infrared detectors.

16. The apparatus of claim 12, wherein the silicon-controlled rectifier control circuits comprise MOSFET silicon-controlled rectifier gate trigger circuits.

17. The apparatus of claim 12, wherein the second circuit board comprises silicon-controlled rectifier circuits.

18. The apparatus of claim 12, wherein the second circuit board comprises snubber capacitors coupled to the silicon-controlled rectifier control circuits.

19. The apparatus of claim 12, wherein the second circuit board comprise varistors.

20. The apparatus of claim 12, wherein the light conductors comprise light-pipes.

21. The apparatus of claim 12, wherein the insulating bodies comprise polycarbonate.

* * * * *